(12) United States Patent
Slavin et al.

(10) Patent No.: US 10,802,097 B2
(45) Date of Patent: Oct. 13, 2020

(54) SYSTEM AND METHOD FOR MAGNETIC RESONANCE IMAGING AN OBJECT UTILIZING A PLURALITY OF FLIP ANGLES

(71) Applicant: GE Precision Healthcare LLC, Wauwatosa, WI (US)

(72) Inventors: Glenn Scott Slavin, Silver Spring, MD (US); Anne Menini, Garching (DE)

(73) Assignee: GE Precision Healthcare LLC, Wauwatosa, WI (US)

( * ) Notice: Subject to any disclaimer, the term of this patent is extended or adjusted under 35 U.S.C. 154(b) by 602 days.

(21) Appl. No.: 15/480,980

(22) Filed: Apr. 6, 2017

(65) Prior Publication Data

US 2018/0292503 A1 Oct. 11, 2018

(51) Int. Cl.
*G01R 33/48* (2006.01)
*G01R 33/50* (2006.01)
(52) U.S. Cl.
CPC .................................. *G01R 33/50* (2013.01)
(58) Field of Classification Search
USPC ............................ 324/300–322; 600/407–435
See application file for complete search history.

(56) References Cited

U.S. PATENT DOCUMENTS

| 7,049,815 | B2* | 5/2006 | Itskovich | G01V 3/32 324/303 |
| 9,008,753 | B2 | 4/2015 | Messroghli | |
| 10,359,490 | B2* | 7/2019 | Kuhara | |
| 2005/0162162 | A1* | 7/2005 | Itskovich | G01V 3/32 324/303 |
| 2014/0232394 | A1* | 8/2014 | Kim | G01R 33/5616 324/309 |
| 2017/0176563 | A1* | 6/2017 | Yablonskiy | G01R 33/50 |
| 2018/0292543 | A1* | 10/2018 | McFarland | G01S 19/49 |

OTHER PUBLICATIONS

Daniel R. Messroghli, et al.; Modified Look-Locker Inversion Recovery (MOLLI) for High-Resolution T1, Mapping of the Heart; Magnetic Resonance in Medicine 52:141-046 (2004).
Kelvin Chow, et al.; Saturation Recovery Single-Shot Acquisition (SASHA) for Myocardial T1 Mapping; Magnetic Resonance in Medicine 71:2082-2095 (2014).

* cited by examiner

*Primary Examiner* — Vincent Q Nguyen
(74) *Attorney, Agent, or Firm* — Armstrong Teasdale LLP

(57) ABSTRACT

A method of magnetic resonance imaging an object utilizing a plurality of flip angles is provided. The method includes transmitting a first preparation pulse corresponding to a first flip angle of the plurality into the object, and receiving a first MR signal from the object based at least in part on the first preparation pulse. The method further includes transmitting a second preparation pulse corresponding to a second flip angle of the plurality into the object, receiving a second MR signal from the object based at least in part on the second preparation pulse, and generating a T1 mapping of the object based at least in part on the first MR signal and the second MR signal. The second flip angle is different than the first flip angle.

20 Claims, 3 Drawing Sheets

SYSTEM AND METHOD FOR MAGNETIC RESONANCE IMAGING AN OBJECT UTILIZING A PLURALITY OF FLIP ANGLES

BACKGROUND

Technical Field

Embodiments of the invention relate generally to magnetic resonance imaging ("MRI") systems, and more specifically, to a system and method for magnetic resonance imaging an object utilizing a plurality of flip angles.

Discussion of Art

MRI is a widely accepted and commercially available technique for obtaining digitized visual images representing the internal structure of objects having substantial populations of atomic nuclei that are susceptible to nuclear magnetic resonance ("NMR"). Many MRI systems use superconductive magnets to scan a subject/patient via imposing a strong main magnetic field on the nuclei in the subject to be imaged. The nuclei are excited by a radio frequency ("RF") signal/pulse transmitted by a RF coil at characteristics NMR (Larmor) frequencies. By spatially disturbing localized magnetic fields surrounding the subject and analyzing the resulting RF responses from the nuclei as the excited protons relax back to their lower energy normal state, a map or image of these nuclei responses as a function of their spatial location is generated and displayed. An image of the nuclei responses provides a non-invasive view of a subject's internal structure.

Many MRI systems generate T1 mappings of an object. Such MRI systems, however, typically use either only inversion recovery ("IR") or saturation recovery ("SR"). Both IR and SR utilize preparation pulses followed by delayed data acquisitions of MR signals. IR usually results in strong and weak MR signals at short and long delay times, respectively. Conversely, SR usually results in weak and strong MR signals at short and long delay times, respectively. As IR and SR typically provide for preparation pulse flip angles a of 180° and 90°, respectively, it is difficult to generate a single T1 mapping that incorporates data from both IR and SR using existing T1 mapping models.

What is needed, therefore, is an improved system and method for magnetic resonance imaging an object utilizing a plurality of flip angles.

BRIEF DESCRIPTION

In an embodiment, a method of magnetic resonance imaging an object utilizing a plurality of flip angles is provided. The method includes transmitting a first preparation pulse corresponding to a first flip angle of the plurality into the object, and receiving a first MR signal from the object based at least in part on the first preparation pulse. The method further includes transmitting a second preparation pulse corresponding to a second flip angle of the plurality into the object, receiving a second MR signal from the object based at least in part on the second preparation pulse, and generating a T1 mapping of the object based at least in part on the first MR signal and the second MR signal. The second flip angle is different than the first flip angle.

In another embodiment, an MRI system for imaging an object utilizing a plurality of flip angles is provided. The MRI system includes an MRI controller operative to transmit a first preparation pulse corresponding to a first flip angle of the plurality into the object, and to receive a first MR signal from the object based at least in part on the first preparation pulse. The MRI controller is further operative to transmit a second preparation pulse corresponding to a second flip angle of the plurality into the object, and to receive a second MR signal from the object based at least in part on the second preparation pulse. The MRI controller is further operative to generate a T1 mapping of the object based at least in part on the first MR signal and the second MR signal. The second flip angle is different than the first flip angle.

In yet another embodiment, a non-transitory computer readable medium storing instructions is provided. The stored instructions are configured to adapt an MRI controller to transmit a first preparation pulse corresponding to a first flip angle of the plurality into an object, and to receive a first MR signal from the object based at least in part on the first preparation pulse. The stored instructions further adapt the MRI controller to transmit a second preparation pulse corresponding to a second flip angle of the plurality into the object, and to receive a second MR signal from the object based at least in part on the second preparation pulse. The stored instructions further adapt the MRI controller to generate a T1 mapping of the object based at least in part on the first MR signal and the second MR signal. The second flip angle is different than the first flip angle.

DRAWINGS

The present invention will be better understood from reading the following description of non-limiting embodiments, with reference to the attached drawings, wherein below:

Figure 1:
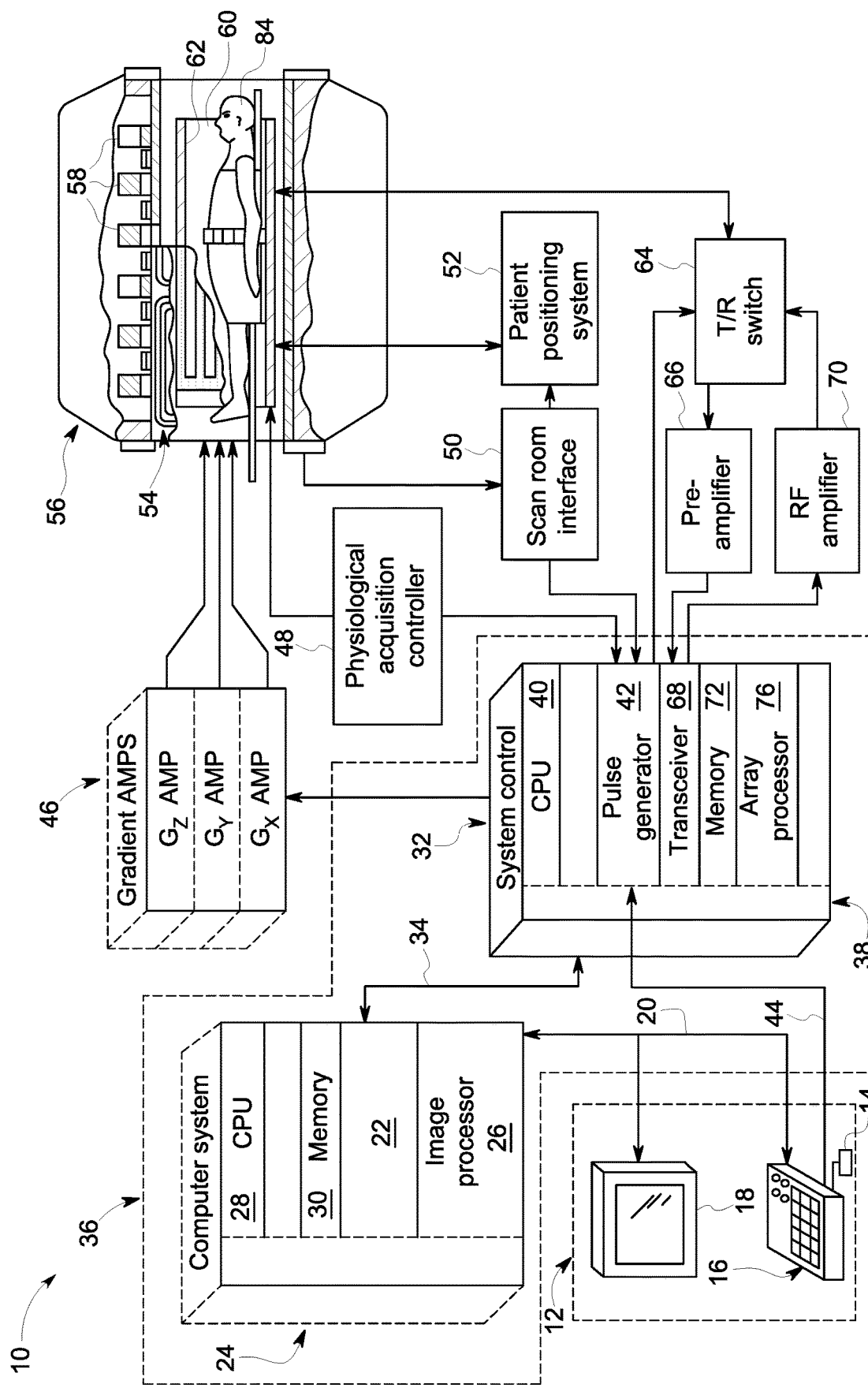
FIG. 1 is a block diagram of an exemplary MRI system, in accordance with an embodiment of the invention.
Figure 3:
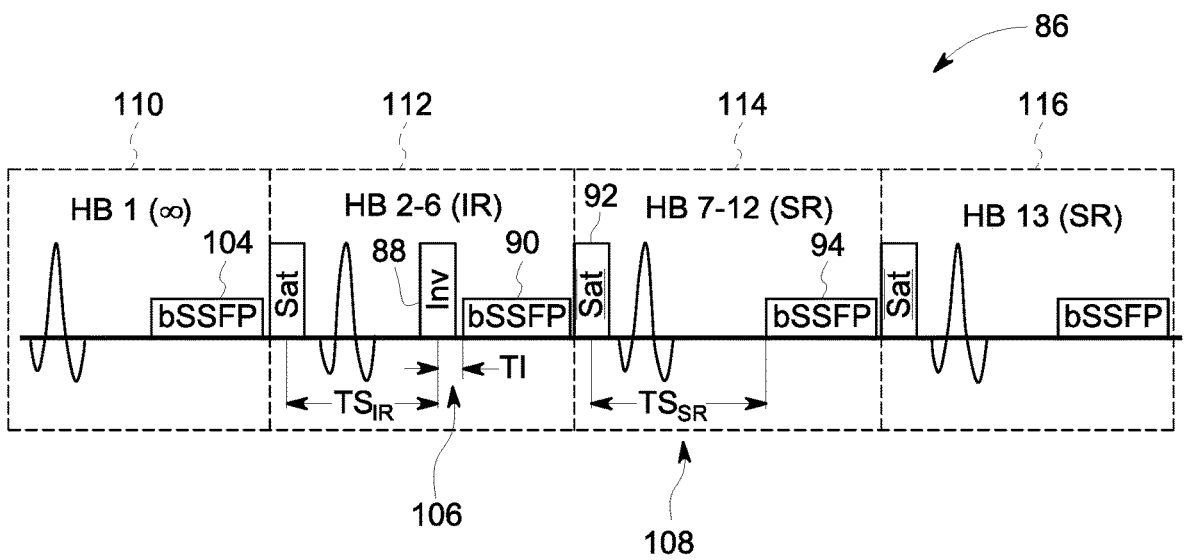
Figure 4:
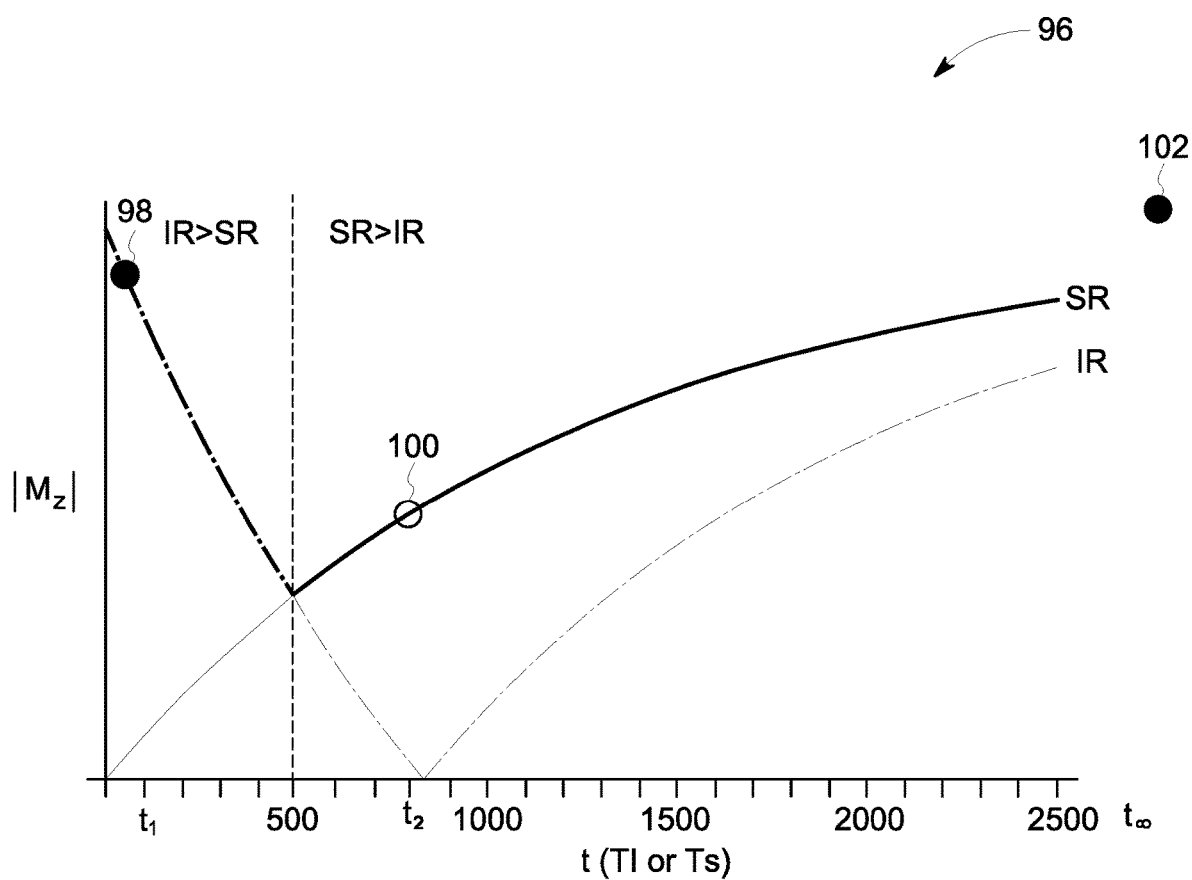

FIG. 3 is a diagram of a pulse sequence performed by the magnet assembly of the system of FIG. 1, in accordance with an embodiment of the invention; and FIG. 4 is a two-dimensional ("2D") slice of a three-dimensional ("3D") surface depicting magnetization ("Mt") over delay time ("t") of one or more data points acquired by scanning an object via the MRI system of FIG. 1, in accordance with an embodiment of the invention.

DETAILED DESCRIPTION

Reference will be made below in detail to exemplary embodiments of the invention, examples of which are illustrated in the accompanying drawings. Wherever possible, the same reference characters used throughout the drawings refer to the same or like parts, without duplicative description.

As used herein, the terms "substantially," "generally," and "about" indicate conditions within reasonably achievable manufacturing and assembly tolerances, relative to ideal desired conditions suitable for achieving the functional purpose of a component or assembly. As used herein, "electrically coupled", "electrically connected", and "electrical communication" mean that the referenced elements are directly or indirectly connected such that an electrical current may flow from one to the other. The connection may include a direct conductive connection, i.e., without an intervening capacitive, inductive or active element, an inductive connection, a capacitive connection, and/or any other suitable electrical connection. Intervening components may be present. As used herein the terms "optical communication", "optically communicate" and "optically connected" mean that the referenced elements are able to direct, reflect, and/or receive photons between each other. The term "flip angle", as used herein, refers to the amount of rotation of the macroscopic magnetization vector produced by an RF pulse, with respect to the direction of the static magnetic field.

Further, while the embodiments disclosed herein are described with respect to an MRI system, it is to be understood that embodiments of the present invention may be applicable to other imaging systems. Further still, as will be appreciated, embodiments of the present invention related imaging systems may be used to analyze tissue generally and are not limited to human tissue.

Referring now to FIG. 1, the major components of an MRI system 10 incorporating an embodiment of the invention are shown. Operation of the system 10 is controlled from the operator console 12, which includes a keyboard or other input device 14, a control panel 16, and a display screen 18. The console 12 communicates through a link 20 with a separate computer system 22 that enables an operator to control the production and display of images on the display screen 18. The computer system 22 includes a number of modules, which communicate with each other through a backplane 24. These include an image processor module 26, a CPU module 28 and a memory module 30, which may include a frame buffer for storing image data arrays. The computer system 22 communicates with a separate system control or control unit 32 through a high-speed serial link 34. The input device 14 can include a mouse, joystick, keyboard, track ball, touch activated screen, light wand, voice control, or any similar or equivalent input device, and may be used for interactive geometry prescription. The computer system 22 and the MRI system control 32 collectively form an "MRI controller" 36.

The MRI system control 32 includes a set of modules connected together by a backplane 38. These include a CPU module 40 and a pulse generator module 42, which connects to the operator console 12 through a serial link 44. It is through link 44 that the system control 32 receives commands from the operator to indicate the scan sequence that is to be performed. The pulse generator module 42 operates the system components to execute the desired scan sequence and produces data which indicates the timing, strength and shape of the RF pulses produced, and the timing and length of the data acquisition window. The pulse generator module 42 connects to a set of gradient amplifiers 46, to indicate the timing and shape of the gradient pulses that are produced during the scan. The pulse generator module 42 can also receive patient data from a physiological acquisition controller 48 that receives signals from a number of different sensors connected to the patient, such as ECG signals from electrodes attached to the patient. And finally, the pulse generator module 42 connects to a scan room interface circuit 50, which receives signals from various sensors associated with the condition of the patient and the magnet system. It is also through the scan room interface circuit 50 that a patient positioning system 52 receives commands to move the patient to the desired position for the scan.

The pulse generator module 42 operates the gradient amplifiers 46 to achieve desired timing and shape of the gradient pulses that are produced during the scan. The gradient waveforms produced by the pulse generator module 42 are applied to the gradient amplifier system 46 having Gx, Gy, and Gz amplifiers. Each gradient amplifier excites a corresponding physical gradient coil in a gradient coil assembly, generally designated 54, to produce the magnetic field gradients used for spatially encoding acquired signals. The gradient coil assembly 54 forms part of a magnet assembly 56, which also includes a polarizing magnet 58 (which in operation, provides a homogenous longitudinal magnetic field $B_0$ throughout a target volume 60 that is enclosed by the magnet assembly 56) and a whole-body (transmit and receive) RF coil 62 (which, in operation, provides a transverse magnetic field $B_1$ that is generally perpendicular to $B_0$ throughout the target volume 60).

The resulting signals emitted by the excited nuclei in the patient may be sensed by the same RF coil 62 and coupled through the transmit/receive switch 64 to a preamplifier 66. The amplifier MR signals are demodulated, filtered, and digitized in the receiver section of a transceiver 68. The transmit/receive switch 64 is controlled by a signal from the pulse generator module 42 to electrically connect an RF amplifier 70 to the RF coil 62 during the transmit mode and to connect the preamplifier 66 to the RF coil 62 during the receive mode. The transmit/receive switch 64 can also enable a separate RF coil (for example, a surface coil) to be used in either transmit or receive mode.

The MR signals picked up by the RF coil 62 are digitized by the transceiver module 68 and transferred to a memory module 72 in the system control 32. A scan is complete when an array of raw k-space data has been acquired in the memory module 72. This raw k-space data/datum is rearranged into separate k-space data arrays for each image to be reconstructed, and each of these is input to an array processor 76 which operates to Fourier transform the data into an array of image data. This image data is conveyed through the serial link 34 to the computer system 22 where it is stored in memory 30. In response to commands received from the operator console 12, this image data may be archived in long-term storage or it may be further processed by the image processor 26 and conveyed to the operator console 12 and presented on the display 18.

Figure 2:
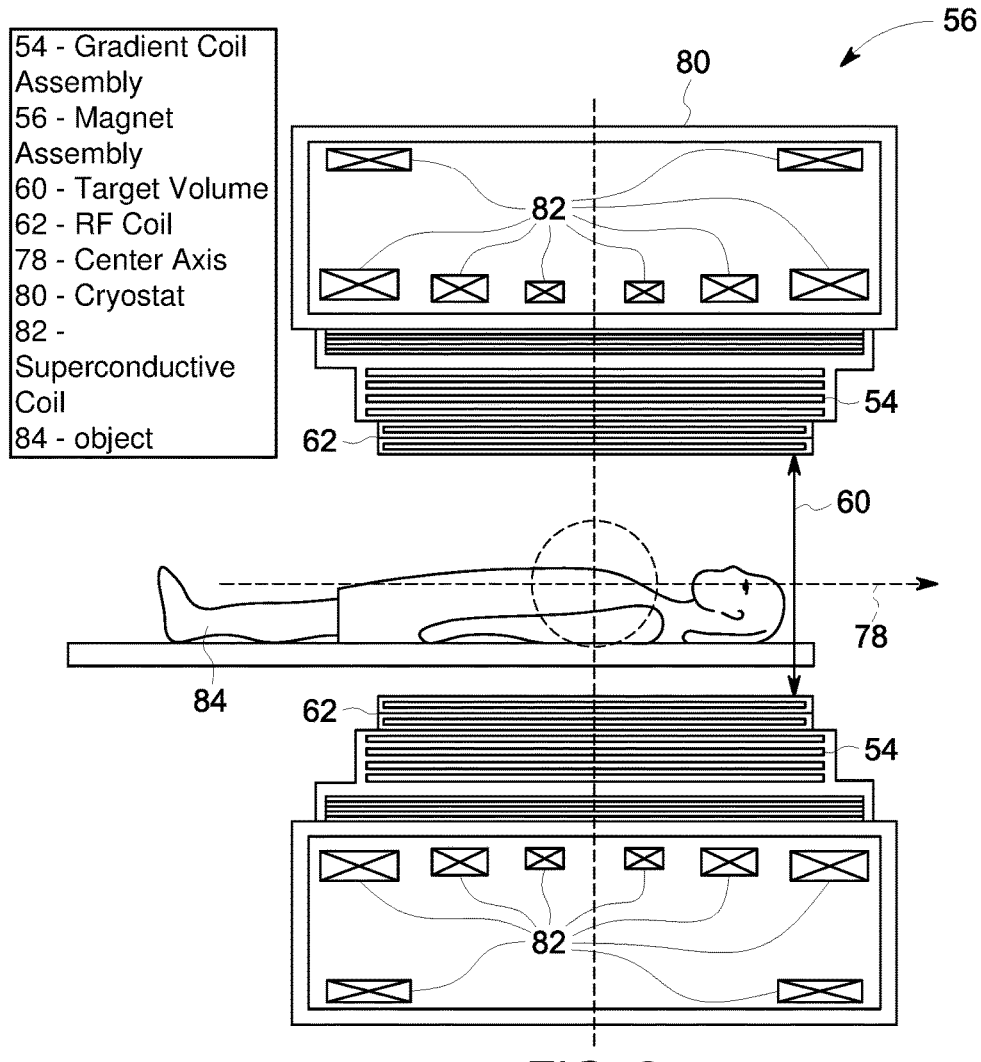
FIG. 2 is a schematic cross-sectional view of a magnet assembly of the MRI system of FIG. 1, in accordance with an embodiment of the invention.

As illustrated in FIG. 2, a schematic side elevation view of the magnet assembly 56 is shown in accordance with an embodiment of the invention. The magnet assembly 56 is cylindrical in shape having a center axis 78. The magnet assembly 56 includes a cryostat 80 and one or more radially aligned longitudinally spaced apart superconductive coils 82 that form the polarizing magnet 58. The superconductive coils 82 are capable of carrying large electrical currents and are designed to create the $B_0$ field within the patient/target volume 60. As will be appreciated, the magnet assembly 56 may further include both a terminal shield and a vacuum vessel (not shown) surrounding the cryostat 80 in order to help insulate the cryostat 80 from heat generated by the rest of the MRI system 10 (FIG. 1). The magnet assembly 56 may still further include other elements such as covers, supports, suspension members, end caps, brackets, etc. (not shown). While the embodiment of the magnet assembly 56 shown in FIGS. 1 and 2 utilizes a cylindrical topology, it should be understood that topologies other than cylindrical may be used. For example, a flat geometry in a split-open MRI system may also utilize embodiments of the invention described below. As further shown in FIG. 2, a patient/imaged subject 84 is inserted into the magnet assembly 56.

Turning now to FIG. 3, a pulse sequence 86 performed by the magnet assembly 56 of the system 10 of FIG. 1, in accordance with an embodiment of the invention, is shown. As will be appreciated, the MRI system 10 transmits a first preparation pulse 88 corresponding to a first flip angle into the object 84, and then receives a first MR signal 90 from/emitted by the object 84 based at least in part on the first preparation pulse 88. The system 10 then transmits a second preparation pulse 92 corresponding to a second flip angle into the object 84, and then receives a second MR signal 94 from/emitted by the object 84 based at least in part on the second preparation pulse 92. The system 10 then generates a T1 mapping of the object 84 based at least in part on the first MR signal 90 and the second MR signal 94. As will be appreciated, the second flip angle is different than the first flip angle.

For example, turning to FIG. 4, a two-dimensional ("2D") slice 96 of a three-dimensional ("3D") surface depicting magnetization ("Mt") over delay time ("t") of one or more data points acquired by scanning an object via the MRI system 10, in accordance with an embodiment of the invention, is shown. Accordingly, in embodiments, the first preparation pulse 88 (FIG. 2) may be an inversion pulse corresponding to a flip angle of 180° that provides for the acquisition of a first data point 98, and the second preparation pulse 92 (FIG. 2) may be a saturation pulse corresponding to a flip angle of 90° that provides for the acquisition of a second data point 100. Thus, the first 98 and the second 100 data points correspond to the first 90 and the second 94 MR signals, respectively, such that the data points 98 and 100 represent the $M_z$ of a pixel/voxel of the object 84 derived from k-space at a first delay time $t_1$ and at a second delay time $t_2$, respectively. As will be appreciated, the first 98 and the second 100 data points may form a curve on the two-dimensional slice 96 which can be fitted to a model in order to calculate the T1 value of the pixel/voxel corresponding to the data points 98 and 100. As will be appreciated, because the data points 98 and 100 are mapped to a surface, e.g., a model/equation system having three (3) or more factors, variables, parameters, and/or constants, the data points 98 and 100 can be modeled by three factors: $M_z$, flip angle a, and delay time t, as opposed to a mere curve which provides for models encompassing only two (2) factors/variables. In certain aspects, the MRI system 10 may acquire a third data point 102 by receiving a third MR signal 104 (FIG. 3), which in embodiments, may occur prior to transmitting the first preparation pulse 88. As will be appreciated, the third data point 102 may also be mapped to the surface and may represent the maximum $M_z$ value of the pixel/voxel corresponding to the first 98 and the second 100 data points.

As will be understood, in embodiments, the first and the second flip angles may be selected such that the first MR signal 90 is higher/stronger at $T_1$ than it would be if the first preparation pulse 88 corresponded to the second flip angle, while the second MR signal 94 is higher/stronger at T2 than it would be if second preparation pulse 92 corresponded to the first flip angle. Accordingly, a first delay time 106 between transmitting the first preparation pulse 88 and receiving the first MR signal 90 may be shorter than a second delay time 108 between transmitting the second preparation pulse 92 and receiving the second MR signal 94. In other words, some embodiments utilize IR T1 acquisitions for short delay times, e.g., <500 ms, when the IR flip angle of 180° provides for a stronger $M_z$ than SR T1 acquisitions, and further utilize SR T1 acquisitions for long delay times, e.g., >500 ms, when the SR flip angle of 90° provides for stronger $M_z$ than IR T1 acquisitions. As will be appreciated, however, other flip angle combinations may be utilized, and/or the delay time(s) may be dependent on the T1 of the object 84. In such embodiments, the first flip angle may be larger than the second flip angle or vice-versa.

Additionally, returning back to FIG. 3, in embodiments, the pulse sequence 86 may be adapted/configured to correspond to a series of heart beats, or other similar cycle and/or application that may benefit from MR acquisitions utilizing more than one flip angle. As such, a plurality of MR signal acquisitions may be performed as groups of modules 110, 112, 114, and 116, where each module 110, 112, 114, 116 corresponds to a different point/beat of a series of heat beats. For example, as shown in FIG. 3, modules 110, 112, 114, and 116 may correspond to four (4) different points/beats of the same heart, in which one (1) MR signal acquisition HB 1 may be obtained during module 110, five (5) and six (6) MR signal acquisitions HB 2-6 and HB 7-12 are obtained during modules 112 and 114, respectively, and one (1) MR signal acquisition HB 13 may be obtained during module 116.

As shown, the third data point 102, i.e., the maximum $M_z$ value, may be obtained 104 during HB 1 in module 112 prior to any magnetization preparation. The first data point 98 may be obtained 90 once during each of the earlier points/beats in HB 2-6 of module 110, i.e., the first data point 98 may be obtained five (5) times. As such, HB 2-6 may be performed via IR in which a saturation pulse is played out immediately after each readout 90. As will be understood, this may reset $M_z$ to 0. It is to be understood, however, that in embodiments, the saturation pulse 92 need not be played out immediately after each readout 90, e.g., a saturation pulse 92 may be delayed after a readout played prior to the next preparation pulse. After a maximum saturation delay time $TS_{IR}$, an inversion pulse may be played out immediately prior to the subsequent readout 90. This minimum TI serves to maximize the dynamic range of the IR component by providing the most negative value for $M_z$. In embodiments, however, the saturation pulses may be played out at arbitrary points prior to the next preparation pulse, e.g., the $TS_{IR}$ may be any value between approximately zero (0) and the aforementioned maximum value. Further, in embodiments, the inversion pulses may be played out anytime between the saturation pulses and each readout value. Additionally, in embodiments, the modules 110, 112, 114, and/or 116 may correspond to different TR repetition times, and/or the number of times that a particular module 110, 112, 114, and/or 116 is repeated, if at all, may vary.

Similar to the first data point 98, the second data point 100 may be obtained once during each of the later points/beats in HB 7-13 of modules 114 and 116, i.e., the second data point 100 may be obtained seven (7) times. As such, HB 7-13 may be performed via SR in which a saturation pulse is played out after every readout to allow the longest possible saturation delay time $TS_{SR}$ prior to the subsequent readout 94. As will be appreciated, a T1 mapping can be generated by plotting the three data points 98, 100, and 102 on a surface as described above.

Finally, it is also to be understood that the system 10 may include the necessary electronics, software, memory, storage, databases, firmware, logic/state machines, microprocessors, communication links, displays or other visual or audio user interfaces, printing devices, and any other input/output interfaces to perform the functions described herein and/or to achieve the results described herein. For example, as previously mentioned, the system may include at least one processor and system memory/data storage structures, which may include random access memory (RAM) and read-only memory (ROM). The at least one processor of the system 10 may include one or more conventional microprocessors and one or more supplementary co-processors such as math co-processors or the like. The data storage structures discussed herein may include an appropriate combination of magnetic, optical and/or semiconductor memory, and may include, for example, RAM, ROM, flash drive, an optical disc such as a compact disc and/or a hard disk or drive.

Additionally, a software application that adapts the controller to perform the methods disclosed herein may be read into a main memory of the at least one processor from a computer-readable medium. The term "computer-readable medium", as used herein, refers to any medium that provides or participates in providing instructions to the at least one processor of the system 10 (or any other processor of a device described herein) for execution. Such a medium may take many forms, including but not limited to, non-volatile media and volatile media. Non-volatile media include, for example, optical, magnetic, or opto-magnetic disks, such as memory. Volatile media include dynamic random access memory (DRAM), which typically constitutes the main memory. Common forms of computer-readable media include, for example, a floppy disk, a flexible disk, hard disk, magnetic tape, any other magnetic medium, a CD-ROM, DVD, any other optical medium, a RAM, a PROM, an EPROM or EEPROM (electronically erasable programmable read-only memory), a FLASH-EEPROM, any other memory chip or cartridge, or any other medium from which a computer can read.

While in embodiments, the execution of sequences of instructions in the software application causes at least one processor to perform the methods/processes described herein, hard-wired circuitry may be used in place of, or in combination with, software instructions for implementation of the methods/processes of the present invention. Therefore, embodiments of the present invention are not limited to any specific combination of hardware and/or software.

It is further to be understood that the above description is intended to be illustrative, and not restrictive. For example, the above-described embodiments (and/or aspects thereof) may be used in combination with each other. Additionally, many modifications may be made to adapt a particular situation or material to the teachings of the invention without departing from its scope.

For example, in an embodiment, a method of magnetic resonance imaging an object utilizing a plurality of flip angles is provided. The method includes transmitting a first preparation pulse corresponding to a first flip angle of the plurality into the object, and receiving a first MR signal from the object based at least in part on the first preparation pulse. The method further includes transmitting a second preparation pulse corresponding to a second flip angle of the plurality into the object, receiving a second MR signal from the object based at least in part on the second preparation pulse, and generating a T1 mapping of the object based at least in part on the first MR signal and the second MR signal. The second flip angle is different than the first flip angle. In certain embodiments, the first flip angle is larger than the second flip angle. In certain embodiments, the first preparation pulse is an inversion pulse and the first flip angle is about 180°, and the second preparation pulse is a saturation pulse and the second flip angle is about 90°. In certain embodiments, the first MR signal is received prior to transmitting the second preparation pulse. In certain embodiments, generating a T1 mapping of the object includes fitting a surface to a model. In such embodiments, the surface includes a first data point and a second data point corresponding to the first MR signal and the second MR signal, respectively. In certain embodiments, the method further includes receiving a third MR signal from the object via the MRI system. In such embodiments, the surface further includes a third data point corresponding to the third MR signal. In certain embodiments, receiving the third MR signal occurs prior to transmitting the first preparation pulse. In certain embodiments, a first delay time between transmitting the first preparation pulse and receiving the first MR signal is shorter than and a second delay time between transmitting the second preparation pulse and receiving the second MR signal. In certain embodiments, the second flip angle results in the second MR signal being stronger at the second delay time than if the second preparation pulse corresponded to the first flip angle.

Yet other embodiments provide for an MRI system for imaging an object utilizing a plurality of flip angles. The MRI system includes an MRI controller operative to transmit a first preparation pulse corresponding to a first flip angle of the plurality into the object, and to receive a first MR signal from the object based at least in part on the first preparation pulse. The MRI controller is further operative to transmit a second preparation pulse corresponding to a second flip angle of the plurality into the object, and to receive a second MR signal from the object based at least in part on the second preparation pulse. The MRI controller is further operative to generate a T1 mapping of the object based at least in part on the first MR signal and the second MR signal. The second flip angle is different than the first flip angle. In certain embodiments, the first flip angle is larger than the second flip angle. In certain embodiments, the first preparation pulse is an inversion pulse and the first flip angle is about 180°, and the second preparation pulse is a saturation pulse and the second flip angle is about 90°. In certain embodiments, the first MR signal is received prior to transmitting the second preparation pulse. In certain embodiments, the MRI controller generates the T1 mapping of the object via fitting a surface to a model, and the surface includes a first data point and a second data point corresponding to the first MR signal and the second MR signal, respectively. In certain embodiments, the MRI controller is further operative to receive a third MR signal from the object via the at least one RF coil, and the surface further includes a third data point corresponding to the third MR signal. In certain embodiments, the third MR signal is received prior to transmitting the first preparation pulse. In certain embodiments, a first delay time between transmitting the first preparation pulse and receiving the first MR signal is shorter than and a second delay time between transmitting the second preparation pulse and receiving the second MR signal. In certain embodiments, the second flip angle results in the second MR signal being stronger at the second delay time than if the second preparation pulse corresponded to the first flip angle.

Yet still other embodiments provide for a non-transitory computer readable medium storing instructions. The stored instructions are configured to adapt an MRI controller to transmit a first preparation pulse corresponding to a first flip angle of the plurality into an object via an MRI system, and to receive a first MR signal from the object via the MRI system based at least in part on the first preparation pulse. The stored instructions further adapt the MRI controller to transmit a second preparation pulse corresponding to a second flip angle of the plurality into the object via the MRI system, and to receive a second MR signal from the object via the MRI system based at least in part on the second preparation pulse. The stored instructions further adapt the MRI controller to generate a T1 mapping of the object based at least in part on the first MR signal and the second MR signal. The second flip angle is different than the first flip angle. In certain embodiments, the first flip angle is larger than the second flip angle. In certain embodiments, the MRI controller generates the T1 mapping of the object via fitting a surface to a model, and the surface includes a first data point and a second data point corresponding to the first MR signal and the second MR signal, respectively.

Accordingly, by utilizing a surface model to merge MR signal data acquired via different flip angles, some embodiments of the present invention may provide for the ability to generate T1 mappings from combined/hybrid IR and SR MR signal acquisition techniques. As such, some embodiments may provide for the ability to utilize IR imaging during the early stages of a series of heart beats, or other similar cycles, when IR may provide for a stronger MR signal than SR, and to utilize SR during the later stages of a series of heart beats when SR may provide for a stronger MR signal than IR. Thus, some embodiments may provide a greater dynamic range for T1 MR acquisitions than traditional techniques.

Additionally, while the dimensions and types of materials described herein are intended to define the parameters of the invention, they are by no means limiting and are exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, terms such as "first," "second," "third," "upper," "lower," "bottom," "top," etc. are used merely as labels, and are not intended to impose numerical or positional requirements on their objects. Further, the limitations of the following claims are not written in means-plus-function format are not intended to be interpreted as such, unless and until such claim limitations expressly use the phrase "means for" followed by a statement of function void of further structure.

This written description uses examples to disclose several embodiments of the invention, including the best mode, and also to enable one of ordinary skill in the art to practice the embodiments of invention, including making and using any devices or systems and performing any incorporated methods. The patentable scope of the invention is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal languages of the claims.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described invention, without departing from the spirit and scope of the invention herein involved, it is intended that all of the subject matter of the above description shown in the accompanying drawings shall be interpreted merely as examples illustrating the inventive concept herein and shall not be construed as limiting the invention.

What is claimed is:

1. A method of magnetic resonance imaging an object utilizing a plurality of flip angles corresponding to preparation radio frequency (RF) pulses comprising:
   transmitting a first preparation pulse corresponding to a first flip angle of the plurality into the object;
   receiving a first MR signal from the object acquired with a first delay time after transmission of the first preparation pulse;
   transmitting a second preparation pulse corresponding to a second flip angle of the plurality into the object;
   receiving a second MR signal from the object acquired with a second delay time after transmission of the second preparation pulse, the second delay time different from the first delay time;
   fitting a first data point corresponding to the first MR signal and a second data point corresponding to the second MR signal to a model;
   generating a T1 mapping of the object based on both the first MR signal and the second MR signal using the model; and
   wherein the second flip angle is different than the first flip angle.

2. The method of claim 1, wherein the first flip angle is larger than the second flip angle.

3. The method of claim 2, wherein the first preparation pulse is an inversion pulse and the first flip angle is about 180°, and the second preparation pulse is a saturation pulse and the second flip angle is about 90°.

4. The method of claim 2, wherein the first MR signal is received prior to transmitting the second preparation pulse.

5. The method of claim 1, wherein generating a T1 mapping of the object comprises:
   fitting a surface to the model; and
   wherein the surface includes the first data point and the second data point.

6. The method of claim 5 further comprising:
   receiving a third MR signal from the object via the MRI system; and
   wherein the surface further includes a third data point corresponding to the third MR signal.

7. The method of claim 6, wherein receiving the third MR signal occurs prior to transmitting the first preparation pulse.

8. The method of claim 1, wherein the first delay time is shorter than the second delay time.

9. The method of claim 8, wherein the second flip angle results in the second MR signal being stronger at the second delay time than if the second preparation pulse corresponded to the first flip angle.

10. An MRI system for imaging an object utilizing a plurality of flip angles corresponding to preparation radio frequency (RF) pulses, the system comprising:
    an MRI controller operative to:
       transmit a first preparation pulse corresponding to a first flip angle of the plurality into the object;
       receive a first MR signal from the object acquired with a first delay time after transmission of the first preparation pulse;
       transmit a second preparation pulse corresponding to a second flip angle of the plurality into the object;
       receive a second MR signal from the object acquired with a second delay time after transmission of the second preparation pulse, the second delay time different from the first delay time;

fit a first data point corresponding to the first MR signal and a second data point corresponding to the second MR signal to a model;

generate a T1 mapping of the object based on both the first MR signal and the second MR signal using the model; and wherein the second flip angle is different than the first flip angle.

11. The MRI system of claim 10, wherein the first flip angle is larger than the second flip angle.

12. The MRI system of claim 11, wherein the first preparation pulse is an inversion pulse and the first flip angle is about 180°, and the second preparation pulse is a saturation pulse and the second flip angle is about 90°.

13. The MRI system of claim 11, wherein the first MR signal is received prior to transmitting the second preparation pulse.

14. The MRI system of claim 10, wherein the MRI controller generates the T1 mapping of the object via fitting a surface to the model; and wherein the surface includes the first data point and the second data point.

15. The MRI system of claim 14, wherein the MRI controller is further operative to:

receive a third MR signal from the object; and wherein the surface further includes a third data point corresponding to the third MR signal.

16. The MRI system of claim 15, wherein the third MR signal is received prior to transmitting the first preparation pulse.

17. The MRI system of claim 10, wherein the first delay time is shorter than the second delay time.

18. The MRI system of claim 17, wherein the second flip angle results in the second MR signal being stronger at the second delay time than if the second preparation pulse corresponded to the first flip angle.

19. A non-transitory computer readable medium storing instructions configured to adapt an MRI controller to:

transmit a first preparation pulse corresponding to a first flip angle of a plurality of flip angles corresponding to preparation radio frequency (RF) pulses into an object;

receive a first MR signal from the object acquired with a first delay time after transmission of the first preparation pulse;

transmit a second preparation pulse corresponding to a second flip angle of the plurality into the object;

receive a second MR signal from the object acquired with a second delay time after transmission of the second preparation pulse, the second delay time different from the first delay time;

fit a first data point corresponding to the first MR signal and a second data point corresponding to the second MR signal to a model;

generate a T1 mapping of the object based on both the first MR signal and the second MR signal using the model; and wherein the second flip angle is different than the first flip angle.

20. The non-transitory computer readable medium of claim 19, wherein the MRI controller generates the T1 mapping of the object via fitting a surface to the model; and wherein the surface includes the first data point and the second data point.

* * * * *